United States Patent
Lai et al.

(10) Patent No.: US 9,704,943 B2
(45) Date of Patent: Jul. 11, 2017

(54) INDUCTOR STRUCTURE AND MANUFACTURING METHOD THEREOF

(71) Applicant: XINTEC INC., Zhongli, Taoyuan County (TW)

(72) Inventors: Wei-Ming Lai, Taoyuan (TW); Yu-Wen Hu, Zhongli (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/462,490

(22) Filed: Aug. 18, 2014

(65) Prior Publication Data
US 2015/0054124 A1 Feb. 26, 2015

Related U.S. Application Data

(60) Provisional application No. 61/870,138, filed on Aug. 26, 2013.

(51) Int. Cl.
*H01L 27/08* (2006.01)
*H01L 49/02* (2006.01)
(Continued)

(52) U.S. Cl.
CPC .......... *H01L 28/10* (2013.01); *H01L 23/3171* (2013.01); *H01L 23/5227* (2013.01); *H01L 23/645* (2013.01); *H01L 24/03* (2013.01); *H01L 24/05* (2013.01); *H01L 24/11* (2013.01); *H01L 24/13* (2013.01); *H01L 23/53238* (2013.01); *H01L 2224/0361* (2013.01); *H01L 2224/0391* (2013.01); *H01L 2224/03912* (2013.01); *H01L 2224/0401* (2013.01); *H01L 2224/05084* (2013.01); *H01L 2224/05147* (2013.01);
(Continued)

(58) Field of Classification Search
CPC ....................................................... H01L 28/10
USPC ....................................................... 257/531
See application file for complete search history.

(56) References Cited

U.S. PATENT DOCUMENTS

2008/0157273 A1 7/2008 Giraudin et al.
2008/0258284 A1* 10/2008 Trezza ................. H01L 21/561
257/685
(Continued)

FOREIGN PATENT DOCUMENTS

CN 1649087 8/2005
CN 101611494 12/2009
(Continued)

*Primary Examiner* — Hsin-Yi Hsieh
(74) *Attorney, Agent, or Firm* — Liu & Liu

(57) ABSTRACT

A manufacturing method of an inductor structure includes the following steps. A protection layer is formed on a substrate, such that bond pads of the substrate are respectively exposed form protection layer openings of the protection layer. A conductive layer is formed on the bond pads and the protection layer. A patterned first photoresist layer is formed on the conductive layer. Copper bumps are respectively formed on the conductive layer located in the first photoresist layer openings. A patterned second photoresist layer is formed on the first photoresist layer, such that at least one of the copper bumps is exposed through second photoresist layer opening and the corresponding first photoresist layer opening. A diffusion barrier layer and an oxidation barrier layer are formed on the copper bump. The first and second photoresist layers, and the conductive layer not covered by the copper bumps are removed.

5 Claims, 8 Drawing Sheets

(51) Int. Cl.
   *H01L 23/00*   (2006.01)
   *H01L 23/31*   (2006.01)
   *H01L 23/522*   (2006.01)
   *H01L 23/64*   (2006.01)
   *H01L 23/532*   (2006.01)

(52) U.S. Cl.
   CPC ........... *H01L 2224/05155* (2013.01); *H01L 2224/05166* (2013.01); *H01L 2224/05644* (2013.01); *H01L 2224/05647* (2013.01); *H01L 2224/11462* (2013.01); *H01L 2224/11474* (2013.01); *H01L 2224/11825* (2013.01); *H01L 2224/11903* (2013.01); *H01L 2224/1355* (2013.01); *H01L 2224/13083* (2013.01); *H01L 2224/13144* (2013.01); *H01L 2224/13147* (2013.01); *H01L 2224/13155* (2013.01); *H01L 2224/13562* (2013.01); *H01L 2224/13582* (2013.01); *H01L 2224/13644* (2013.01); *H01L 2224/13655* (2013.01); *H01L 2924/01028* (2013.01); *H01L 2924/01029* (2013.01); *H01L 2924/01079* (2013.01); *H01L 2924/1206* (2013.01)

(56) References Cited

U.S. PATENT DOCUMENTS

| | | | |
|---|---|---|---|
| 2009/0283903 A1* | 11/2009 | Park | H01L 24/03 |
| | | | 257/737 |
| 2010/0244263 A1* | 9/2010 | Lin | H01L 23/5227 |
| | | | 257/758 |
| 2010/0246152 A1 | 9/2010 | Lin et al. | |
| 2012/0007231 A1* | 1/2012 | Chang | H01L 24/11 |
| | | | 257/737 |
| 2012/0326297 A1* | 12/2012 | Choi | H01L 23/3171 |
| | | | 257/737 |

FOREIGN PATENT DOCUMENTS

| | | |
|---|---|---|
| TW | 200625596 | 7/2006 |
| TW | 200834843 | 8/2008 |
| TW | 201128753 | 8/2011 |
| TW | 201133733 | 10/2011 |
| TW | 201138042 | 11/2011 |
| TW | 201203405 | 1/2012 |
| TW | 201207967 | 2/2012 |

* cited by examiner

INDUCTOR STRUCTURE AND MANUFACTURING METHOD THEREOF

RELATED APPLICATIONS

This application claims priority to U.S. provisional Application Ser. No. 61/870,138, filed Aug. 26, 2013, which is herein incorporated by reference.

BACKGROUND

Field of Invention

The present invention relates to an inductor structure and a manufacturing method thereof.

Description of Related Art

A conventional inductor structure may include a silicon substrate and plural copper bumps. The silicon substrate has plural bond pads. The copper bumps are respectively formed on the bond pads by electrolytic deposition, and have high frequency transmission performance. In subsequent process to the formation of the bumps, a ball grid array (BGA) or conductive protruding blocks may be electrically connected to the bond pads of the silicon substrate by the copper bumps. In that tin material and lead material cannot be directly adhered to the copper bumps, after the copper bumps are completely formed by electrolytic deposition, a nickel layer and a gold layer need to be formed in sequence by electrolytic deposition. The nickel layer has high impedance property to prevent the gold layer and the copper bump from fusing in high temperature ambience, while the gold layer can prevent the copper bump from oxidation.

The BGA or the conductive protruding blocks can be adhered to the copper bumps through the nickel layers and the gold layers, but, in fact, only the small number of the copper bumps in the inductor structure need to be electrically connected to the conductive protruding blocks or the BGA during the subsequent process, such as a bumping process or a BGA process, and most of the copper bumps do not need to be electrically connected to the BGA or the conductive protruding blocks. However, in general, when the inductor structure is manufactured, all of the copper bumps are formed with the nickel layers and the gold layers by electrolytic deposition due to limited process capability.

In this regard, the materials (e.g., gold) are wasted, and the unnecessary nickel layers and the gold layers formed on all of the copper bumps by electrolytic deposition increase the total resistance of the lines of the inductor structure and reduce the efficiency of the inductor structure. As such, the inductance of the inductor structure is difficultly improved.

SUMMARY

An aspect of the present invention is to provide an inductor structure.

According to an embodiment of the present invention, an inductor structure includes a substrate, a protection layer, a patterned conductive layer, a plurality of copper bumps, a diffusion barrier layer, and an oxidation barrier layer. The substrate has a plurality of bond pads. The protection layer is located on the substrate and the bond pads and includes a plurality of protection layer openings. The bond pads are respectively exposed through the protection layer openings. The conductive layer is located on the bond pads and a surface of the protection layer adjacent to the protection layer openings. The copper bumps are located on the conductive layer. The diffusion barrier layer is located on at least one of the copper bumps. The copper bump covered by the diffusion barrier layer is between the diffusion barrier layer and the conductive layer. The oxidation barrier layer is located on the diffusion barrier layer.

In one embodiment of the present invention, the inductor structure includes a nonmetal passivation layer. The nonmetal passivation layer is located on the protection layer, the copper bumps, the diffusion barrier layer, and the oxidation barrier layer. The nonmetal passivation layer has a nonmetal passivation layer opening, and the oxidation barrier layer is exposed through the nonmetal passivation layer opening.

In one embodiment of the present invention, the nonmetal passivation layer is made of a material including oxide or nitride.

In one embodiment of the present invention, the inductor structure includes a metal division layer. The metal division layer covers surfaces of the copper bumps, the diffusion barrier layer, and the oxidation barrier layer.

In one embodiment of the present invention, the metal division layer is made of a material including gold.

In one embodiment of the present invention, the diffusion barrier layer is made of a material including nickel.

In one embodiment of the present invention, the oxidation barrier layer is made of a material including gold.

Another aspect of the present invention is to provide a manufacturing method of an inductor structure.

According to an embodiment of the present invention, a manufacturing method of an inductor structure includes the following steps. (a) A substrate having a plurality of bond pads is provided. (b) A protection layer having a plurality of protection layer openings is formed on the substrate and the bond pads, such that the bond pads are respectively exposed through the protection layer openings. (c) A conductive layer is formed on the bond pads and the protection layer. (d) A patterned first photoresist layer is formed on the conductive layer, such that the conductive layer adjacent to the protection layer openings is exposed through a plurality of first photoresist layer openings of the first photoresist layer. (e) A plurality of copper bumps are formed on the conductive layer that is in the first photoresist layer openings. (f) A patterned second photoresist layer is formed on the first photoresist layer. A second photoresist layer opening of the second photoresist layer is aligned with at least one of the copper bumps, such that at least one of the copper bumps is exposed through the second photoresist layer opening and the corresponding first photoresist layer opening. (g) A diffusion barrier layer and an oxidation barrier layer are formed in sequence on the copper bump that is exposed through the second photoresist layer opening. (h) The first and second photoresist layers, and the conductive layer that is not covered by the copper bumps are removed.

In one embodiment of the present invention, the manufacturing method of the inductor structure further includes: a nonmetal passivation layer is formed on the protection layer, the copper bumps, the diffusion barrier layer, and the oxidation barrier layer. The nonmetal passivation layer is patterned, such that the oxidation barrier layer is exposed through a nonmetal passivation layer opening of the nonmetal passivation layer.

In one embodiment of the present invention, the manufacturing method of the inductor structure further includes: a metal division layer is formed to cover surfaces of the copper bumps, the diffusion barrier layer, and the oxidation barrier layer.

In one embodiment of the present invention, forming the metal division layer on the surfaces of the copper bumps, the diffusion barrier layer, and the oxidation barrier layer includes: a chemical plating treatment is performed to form the metal division layer on the surfaces of the copper bumps, the diffusion barrier layer, and the oxidation barrier layer.

In one embodiment of the present invention, step (b) includes: the protection layer is patterned, such that the protection layer has the protection layer openings.

In one embodiment of the present invention, step (e) includes: an electrolytic deposition treatment is performed to form the copper bumps on the conductive layer that is in the first photoresist layer openings.

In one embodiment of the present invention, step (g) includes: electrolytic deposition treatments are performed to form the diffusion barrier layer and the oxidation barrier layer in sequence on the copper bump that is exposed through the second photoresist layer opening.

In one embodiment of the present invention, step (h) includes: the conductive layer that is not covered by the copper bumps is etched.

In the aforementioned embodiments of the present invention, the inductor structure and the manufacturing method thereof can form the diffusion barrier layer and the oxidation barrier layer on a selected copper bump, such that the diffusion barrier layer and the oxidation barrier layer are formed on the selected copper bump that needs to be electrically connected to a conductive protruding block or a BGA during subsequent process (e.g., a bumping process or a BGA process), and the diffusion barrier layer and the oxidation barrier layer are not formed on other copper bumps. As a result, the inductor structure and the manufacturing method thereof can save the material costs of the diffusion barrier layer and the oxidation barrier layer, and the total resistance of the lines of the inductor structure can be reduced, such that the efficiency of the inductor structure is improved. Therefore, the inductance of the inductor structure can also be improved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
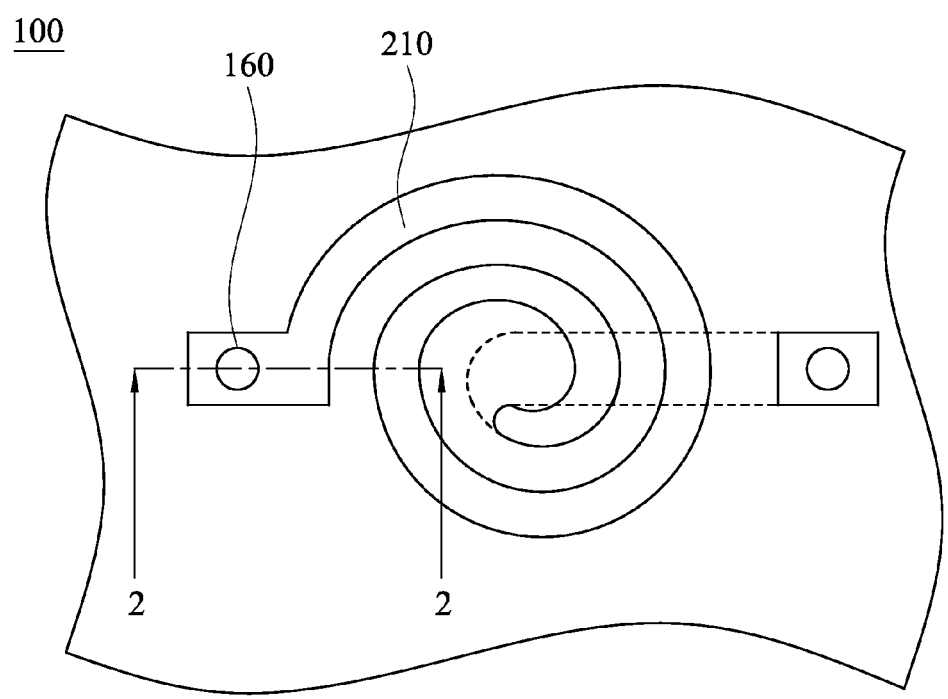
FIG. 1 is a top view of an inductor structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
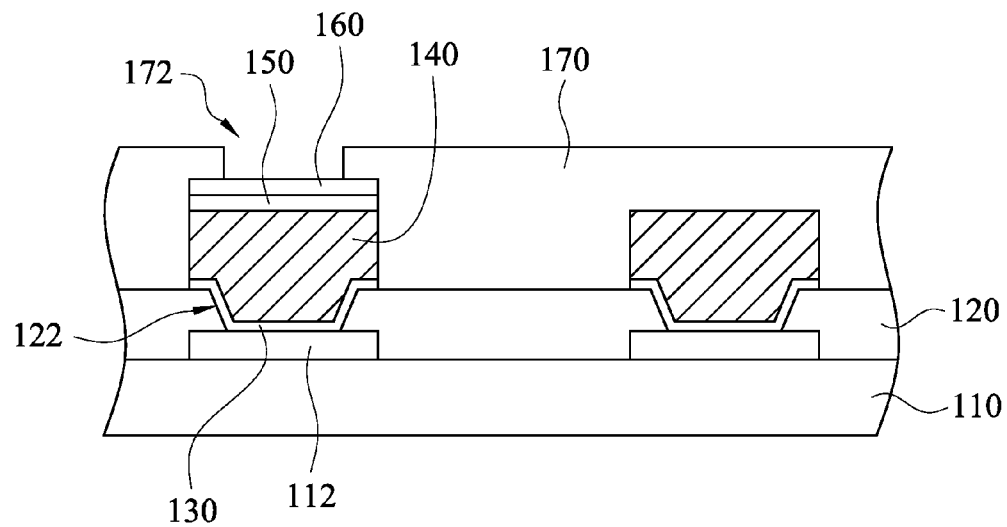
FIG. 2 is a cross-sectional view of the inductor structure taken along line 2-2 shown in FIG. 1.

FIG. 1 is a top view of an inductor structure 100 according to one embodiment of the present invention. FIG. 2 is a cross-sectional view of the inductor structure 100 taken along line 2-2 shown in FIG. 1. In order to simplify the following description, a line layer 210 shown in FIG. 1 will not be shown in other drawings. As shown in FIG. 1 and FIG. 2, the inductor structure 100 includes a substrate 110, a protection layer 120, a patterned conductive layer 130, a plurality of copper bumps 140, a diffusion barrier layer 150, and an oxidation barrier layer 160. The substrate 110 has a plurality of bond pads 112. The protection layer 120 is located on the substrate 110 and the bond pads 112. The protection layer 120 includes a plurality of protection layer openings 122, and the bond pads 112 are respectively exposed through the protection layer openings 122. The conductive layer 130 is located on the surfaces of the bond pads 112 facing the protection layer openings 122, and on the surface of the protection layer 120 adjacent to the protection layer openings 122. The copper bumps 140 are located on the conductive layer 130. The diffusion barrier layer 150 is located on at least one of the copper bumps 140, such that the copper bump 140 covered by the diffusion barrier layer 150 is between the diffusion barrier layer 150 and the conductive layer 130. The oxidation barrier layer 160 is located on the surface of the diffusion barrier layer 150 facing away from the copper bump 140. The diffusion barrier layer 150 and the oxidation barrier layer 160 may be formed on the copper bump 140 by electrolytic deposition.

In this embodiment, the substrate 110 may be made of a material including silicon. The protection layer 120 may be made of a material including polymer, oxide (e.g., $SiO_2$), or nitride. The bond pad 112 may be made of a material including aluminum. The conductive layer 130 may be made of a material including titanium and copper. The diffusion barrier layer 150 may be made of a material including nickel, such that the diffusion barrier layer 150 has high impedance property to prevent the oxidation barrier layer 160 and the copper bump 140 from fusing in high temperature ambience. The oxidation barrier layer 160 may made of a material including gold, such that the oxidation barrier layer 160 can prevent the copper bump 140 from oxidation. However, the present invention is not limited to the aforementioned materials.

Moreover, the inductor structure 100 further includes a nonmetal passivation layer 170. The nonmetal passivation layer 170 is located on the protection layer 120, the copper bumps 140, the diffusion barrier layer 150, and the oxidation barrier layer 160. The nonmetal passivation layer 170 has a nonmetal passivation layer opening 172, such that the oxidation barrier layer 160 can be exposed through the nonmetal passivation layer opening 172. The nonmetal passivation layer 170 may prevent moisture and dust from entering the inductor structure 100. Therefore, the nonmetal passivation layer 170 prevents the copper bumps 140 and the diffusion barrier layer 150 from oxidation. In this embodiment, the nonmetal passivation layer 170 may be made of a material including polymer, oxide (e.g., $SiO_2$) or nitride, but the present invention is not limited in this regard.

During subsequent process for the inductor structure 100, such as a bumping process or a BGA process, a conductive protruding block or a BGA may be adhered to the oxidation barrier layer 160, such that the conductive protruding block or the BGA may be electrically connected to the conductive layer 130 and the bond pad 112 by the copper bump 140 with the diffusion barrier layer 150 and the oxidation barrier layer 160 (e.g., the left copper bump 140 shown in FIG. 2). Another copper bump 140 without the diffusion barrier layer 150 and the oxidation barrier layer 160 (e.g., the right copper bump 140 shown in FIG. 2) is covered by the nonmetal passivation layer 170, and the right copper bump 140 is not adhered to the conductive protruding block or the BGA in the subsequent process. As a result, the inductor structure 100 can save the material costs of the diffusion barrier layer 150 and the oxidation barrier layer 160, and the total resistance of the lines of the inductor structure 100 can be reduced, such that the efficiency of the inductor structure 100 is improved. Therefore, the inductance of the inductor structure 100 can also be improved.

Figure 3:
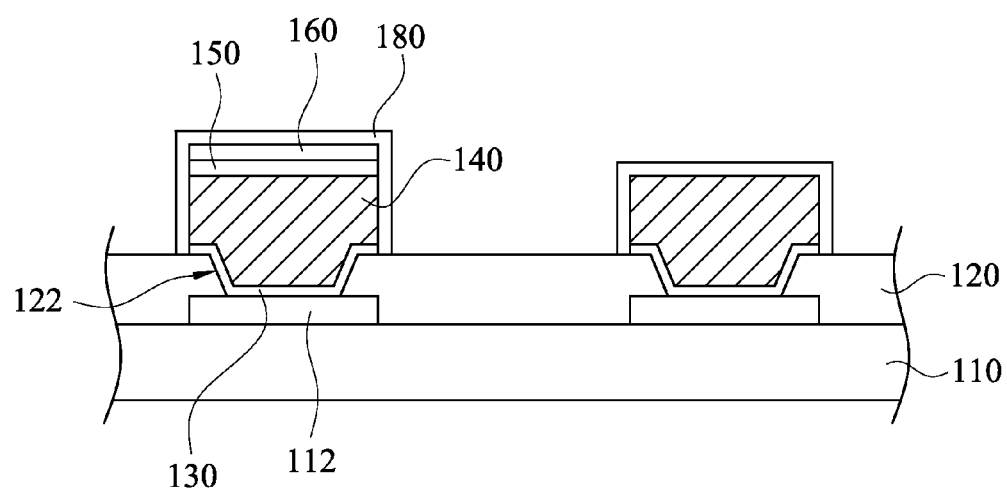
FIG. 3 is a cross-sectional view of an inductor structure according to one embodiment of the present invention, in which the position of the cut line is the same that of FIG. 2.

FIG. 3 is a cross-sectional view of an inductor structure 100a according to one embodiment of the present invention, in which the position of the cut line is the same that of FIG. 2. The inductor structure 100a includes the substrate 110, the protection layer 120, the copper bumps 140, the patterned conductive layer 130, the diffusion barrier layer 150, and the oxidation barrier layer 160. The difference between this embodiment and the embodiment shown in FIG. 2 is that the inductor structure 100a does not include the nonmetal passivation layer 170 (see FIG. 2), but includes a metal division layer 180. The metal division layer 180 covers the surfaces of the copper bump 140, the diffusion barrier layer 150, and the oxidation barrier layer 160. The metal division layer 180 may be made of a material including gold, and the metal division layer 180 may be formed on the copper bump 140 by chemical plating. The metal division layer 180 can prevent the copper bump 140 and the diffusion barrier layer 150 from oxidation.

Figure 4:
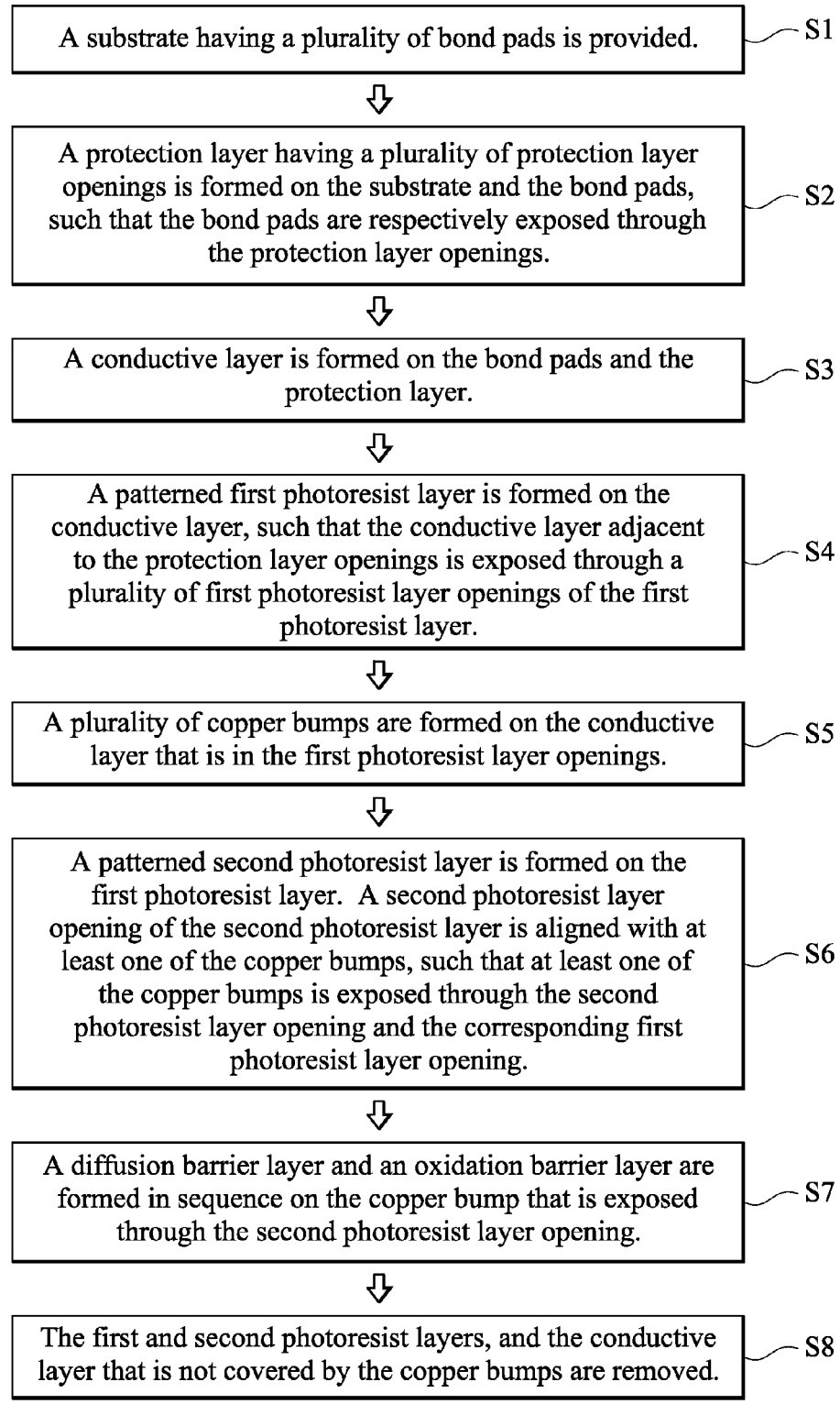
FIG. 4 is a flow chart of a manufacturing method of an inductor structure according to one embodiment of the present invention.

FIG. 4 is a flow chart of a manufacturing method of an inductor structure according to one embodiment of the present invention. In step S1, a substrate having a plurality of bond pads is provided. Thereafter in step S2, a protection layer having a plurality of protection layer openings is formed on the substrate and the bond pads, such that the bond pads are respectively exposed through the protection layer openings. Next in step S3, a conductive layer is formed on the bond pads and the protection layer. Thereafter in step S4, a patterned first photoresist layer is formed on the conductive layer, such that the conductive layer adjacent to the protection layer openings is exposed through a plurality of first photoresist layer openings of the first photoresist layer. Next in step S5, a plurality of copper bumps are formed on the conductive layer that is in the first photoresist layer openings. Thereafter in step S6, a patterned second photoresist layer is formed on the first photoresist layer. A second photoresist layer opening of the second photoresist layer is aligned with at least one of the copper bumps, such that at least one of the copper bumps is exposed through the second photoresist layer opening and the corresponding first photoresist layer opening. Next in step S7, a diffusion barrier layer and an oxidation barrier layer are formed in sequence on the copper bump that is exposed through the second photoresist layer opening. Finally in step S8, the first and second photoresist layers, and the conductive layer that is not covered by the copper bumps are removed.

In the following description, the aforesaid steps of the manufacturing method of the inductor structure will be described.

Figure 5:
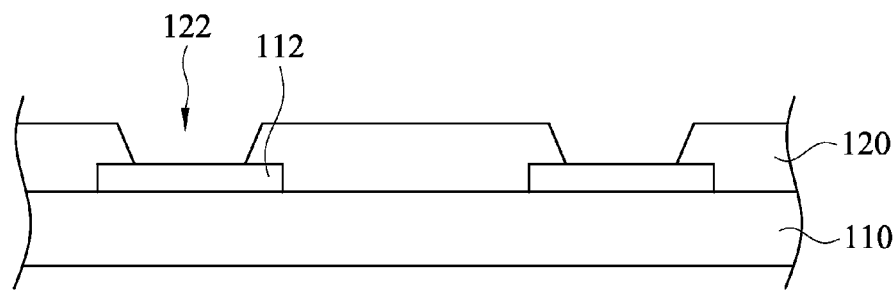
FIG. 5 is a cross-sectional view of bond pads after being respectively exposed through protection layer openings show in FIG. 4.

FIG. 5 is a cross-sectional view of bond pads 112 after being respectively exposed through protection layer openings 122 show in FIG. 4. As shown in FIG. 4 and FIG. 5, a substrate 110 having the bond pads 112 is provided. Thereafter, a protection layer 120 having the protection layer openings 122 is formed on the substrate 110 and the bond pads 112, such that the bond pads 112 are respectively exposed through the protection layer openings 122. A pattering process may be performed on the protection layer 120, such that the protection layer 120 has the protection layer openings 122. The pattering process may include exposure process, development process, and etching process.

Figure 6:
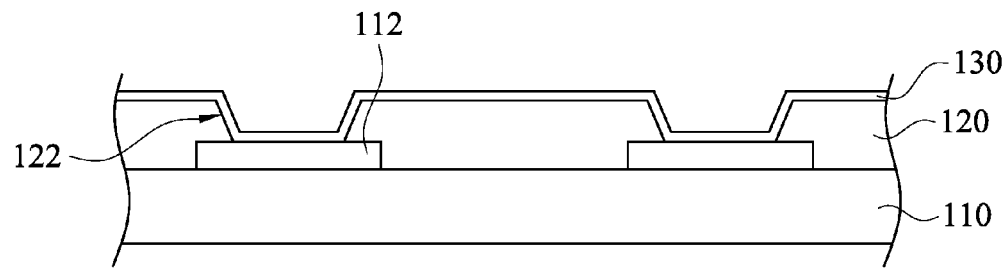
FIG. 6 is a cross-sectional view of a conductive layer after being formed on the bond pads and a protection layer shown in FIG. 5.

FIG. 6 is a cross-sectional view of a conductive layer 130 after being formed on the bond pads 112 and the protection layer 120 shown in FIG. 5. As shown in FIG. 5 and FIG. 6, after the bond pads 112 are exposed through the protection layer openings 122, the conductive layer 130 may be formed on the bond pads 112 and the protection layer 120 by sputtering.

Figure 7:
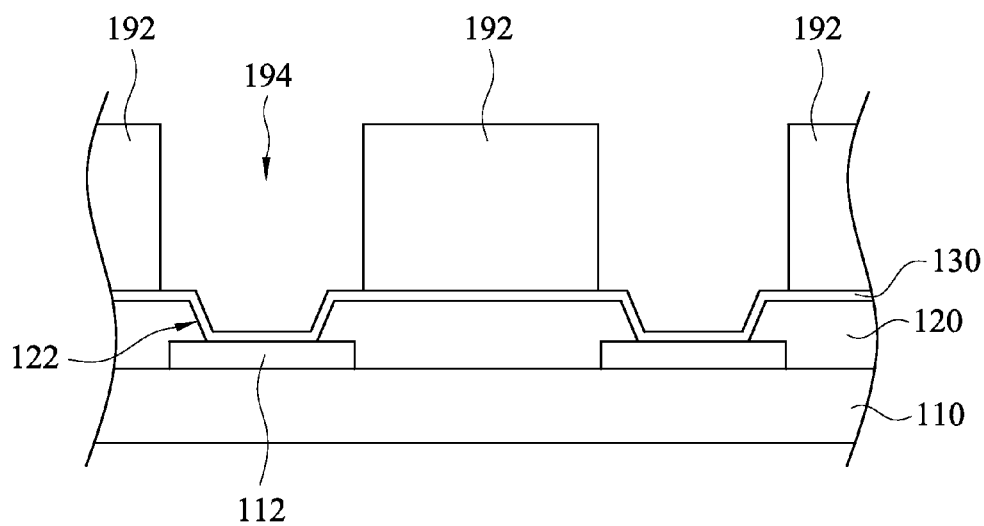
FIG. 7 is a cross-sectional view of a patterned first photoresist layer after being formed on the conductive layer shown in FIG. 6.

FIG. 7 is a cross-sectional view of a patterned first photoresist layer 192 after being formed on the conductive layer 130 shown in FIG. 6. As shown in FIG. 6 and FIG. 7, after the conductive layer 130 is formed on the bond pads 112 and the protection layer 120, the patterned first photoresist layer 192 may be formed on the conductive layer 130, such that the conductive layer 130 adjacent to the protection layer openings 122 is exposed through the first photoresist layer openings 194 of the first photoresist layer 192.

Figure 8:
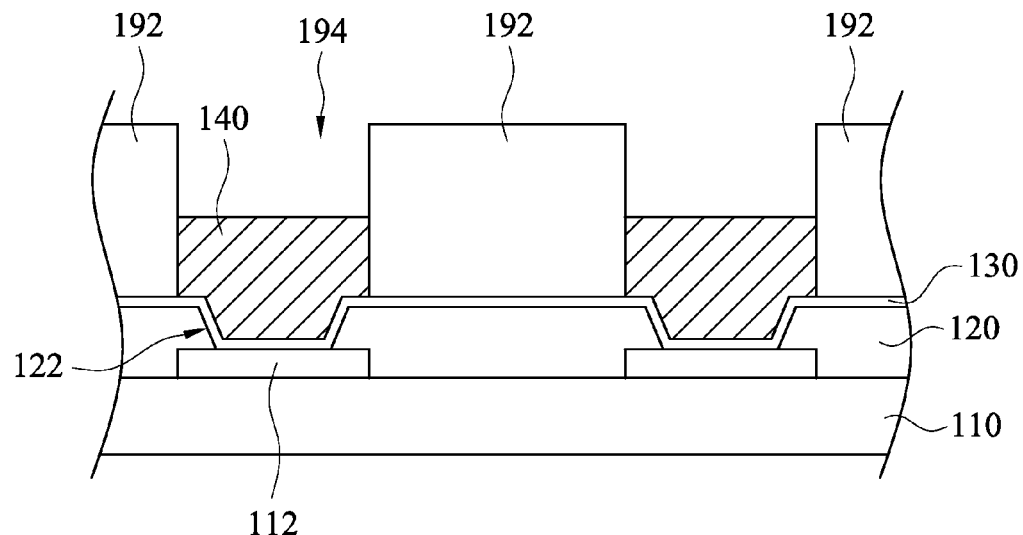
FIG. 8 is a cross-sectional view of copper bumps after being formed on the conductive layer that is in first photoresist layer openings shown in FIG. 7.

FIG. 8 is a cross-sectional view of copper bumps 140 after being formed on the conductive layer 130 that is in the first photoresist layer openings 194 shown in FIG. 7. As shown in FIG. 7 and FIG. 8, after the patterned first photoresist layer 192 is formed on the conductive layer 130, the copper bumps 140 may be formed on the conductive layer 130 that is in the first photoresist layer openings 194. An electrolytic deposition treatment may be performed to form the copper bumps 140 on the conductive layer 130 that is in the first photoresist layer openings 194.

Figure 9:
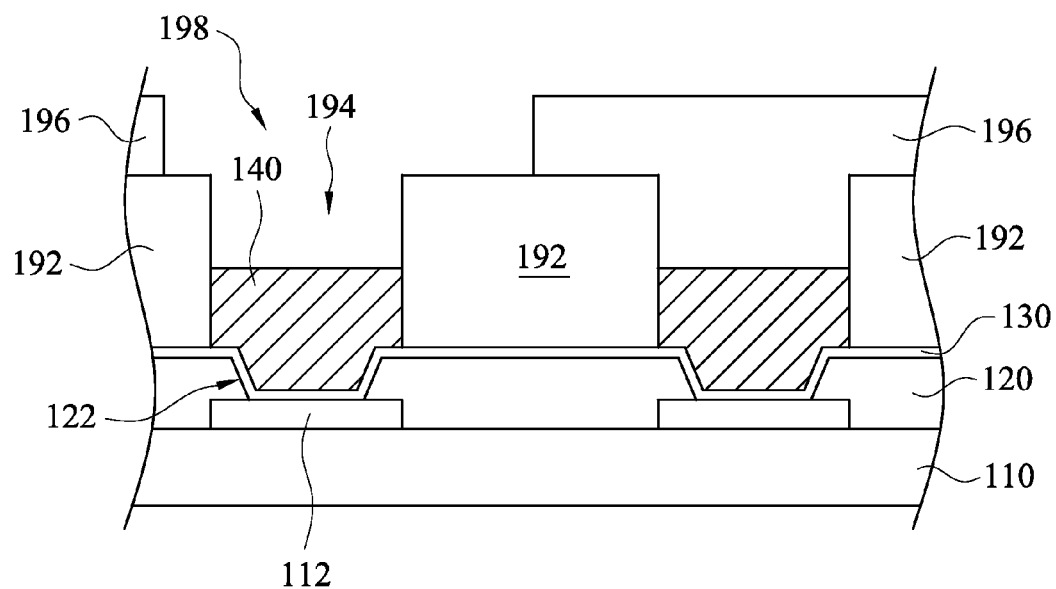
FIG. 9 is a cross-sectional view of a patterned second photoresist layer after being formed on the first photoresist layer shown in FIG. 8.

FIG. 9 is a cross-sectional view of a patterned second photoresist layer 196 after being formed on the first photoresist layer 192 shown in FIG. 8. As shown in FIG. 8 and FIG. 9, after the copper bumps 140 are respectively formed on the conductive layer 130 that is in the first photoresist layer openings 194, the patterned second photoresist layer 196 may be formed on the first photoresist layer 192. The second photoresist layer opening 198 of the second photoresist layer 196 is aligned with at least one of the copper bumps 140, such that at least one of the copper bumps 140 is exposed through the second photoresist layer opening 198 and the corresponding first photoresist layer opening 194.

Figure 10:
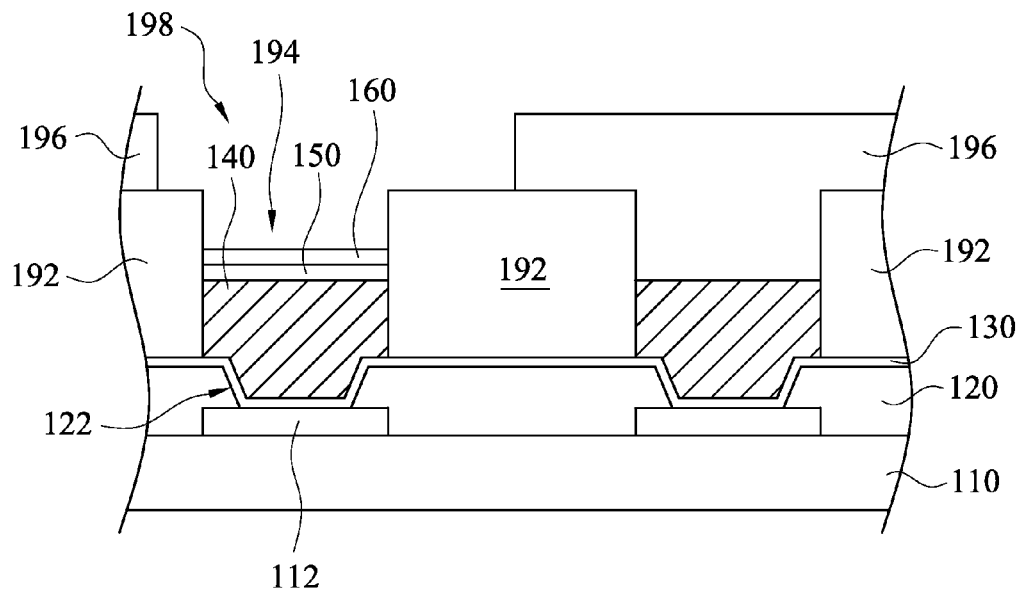
FIG. 10 is a cross-sectional view of a diffusion barrier layer and an oxidation barrier layer after being formed on the copper bump that is exposed through a second photoresist layer opening shown in FIG. 9.

FIG. 10 is a cross-sectional view of a diffusion barrier layer 150 and an oxidation barrier layer 160 after being formed on the copper bump 140 that is exposed through the second photoresist layer opening 198 shown in FIG. 9. As shown in FIG. 9 and FIG. 10, after at least one of the copper bumps 140 is exposed through the second photoresist layer opening 198 and the corresponding first photoresist layer opening 194, the diffusion barrier layer 150 and the oxidation barrier layer 160 are formed in sequence on the copper bump 140 that is exposed through the second photoresist layer opening 198. Electrolytic deposition treatments may be performed to form the diffusion barrier layer 150 and the oxidation barrier layer 160 in sequence on the copper bump 140 that is exposed through the second photoresist layer opening 198.

Figure 11:
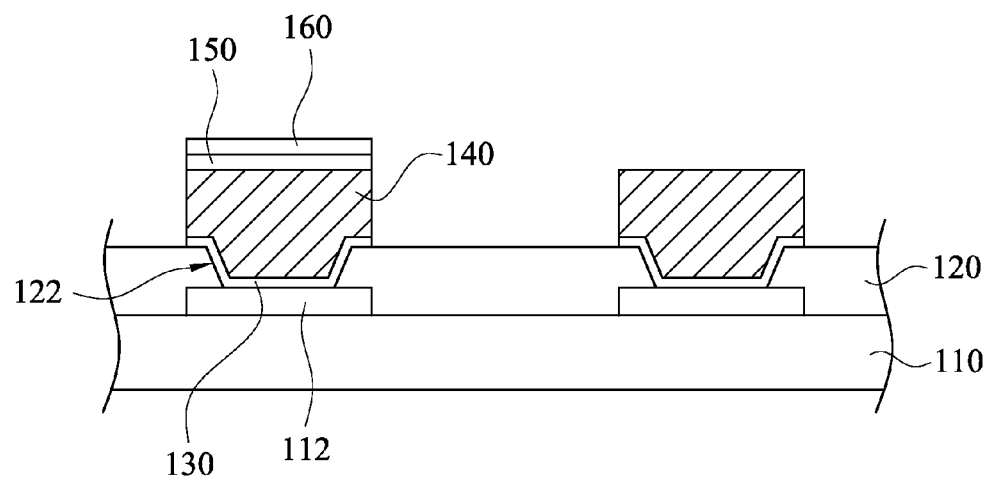
FIG. 11 is a cross-sectional view of the first and second photoresist layers, and the conductive layer that is not covered by the copper bumps shown in FIG. 10 after being removed.

FIG. 11 is a cross-sectional view of the first and second photoresist layers 192, 196, and the conductive layer 130 that is not covered by the copper bumps 140 shown in FIG. 10 after being removed. As shown in FIG. 10 and FIG. 11, after the diffusion barrier layer 150 and the oxidation barrier layer 160 are formed in sequence on the copper bump 140 that is exposed through the second photoresist layer opening 198, the first and second photoresist layers 192, 196, and the conductive layer 130 that is not covered by the copper bumps 140 may be removed, such that the structure of FIG. 11 is obtained. The conductive layer 130 that is not covered by the copper bumps 140 may be etched to remove by an etching process.

As shown in FIG. 2 and FIG. 11, after the first and second photoresist layers 192, 196, and the conductive layer 130 that is not covered by the copper bumps 140 are removed, a nonmetal passivation layer 170 may be formed on the protection layer 120, the copper bumps 140, the diffusion barrier layer 150, and the oxidation barrier layer 160. Thereafter, the nonmetal passivation layer 170 may be patterned, such that the nonmetal passivation layer 170 has a nonmetal passivation layer opening 172 that is aligned with the copper bumps 140. As a result, the oxidation barrier layer 160 may be exposed through the nonmetal passivation layer opening 172, and the inductor structure 100 of FIG. 2 is obtained.

As a shown in FIG. 3 and FIG. 11, after the first and second photoresist layers 192, 196, and the conductive layer 130 that is not covered by the copper bumps 140 are removed, a metal division layer 180 may be formed to cover the surfaces of the copper bumps 140, the diffusion barrier layer 150, and the oxidation barrier layer 160. As a result, the inductor structure 100a of FIG. 3 may be obtained. A chemical plating treatment may be performed to form the metal division layer 180 on the surfaces of the copper bumps 140, the diffusion barrier layer 150, and the oxidation barrier layer 160.

Compared with the prior arts, the inductor structure and the manufacturing method thereof can form the diffusion barrier layer and the oxidation barrier layer on a selected copper bump, such that the diffusion barrier layer and the oxidation barrier layer are formed on the selected copper bump that needs to be electrically connected to a conductive protruding block or a BGA during subsequent process (e.g., a bumping process or a BGA process), and the diffusion barrier layer and the oxidation barrier layer are not formed on other copper bumps. As a result, the inductor structure and the manufacturing method thereof can save the material costs of the diffusion barrier layer and the oxidation barrier layer, and the total resistance of the lines of the inductor structure can be reduced, such that the efficiency of the inductor structure is improved. Therefore, the inductance of the inductor structure can also be improved.

Figure 12A:
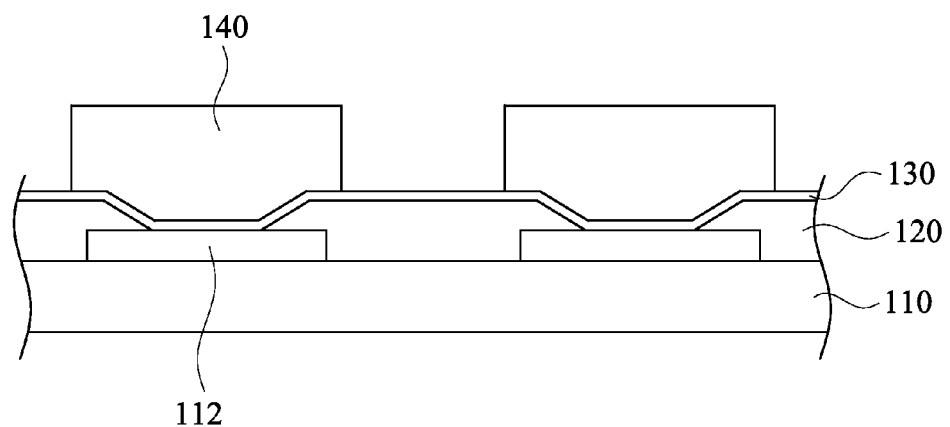
FIGS. 12A to 12D are cross-sectional views of an inductor structure when being manufactured according to one embodiment of the present invention.
Figure 12B:
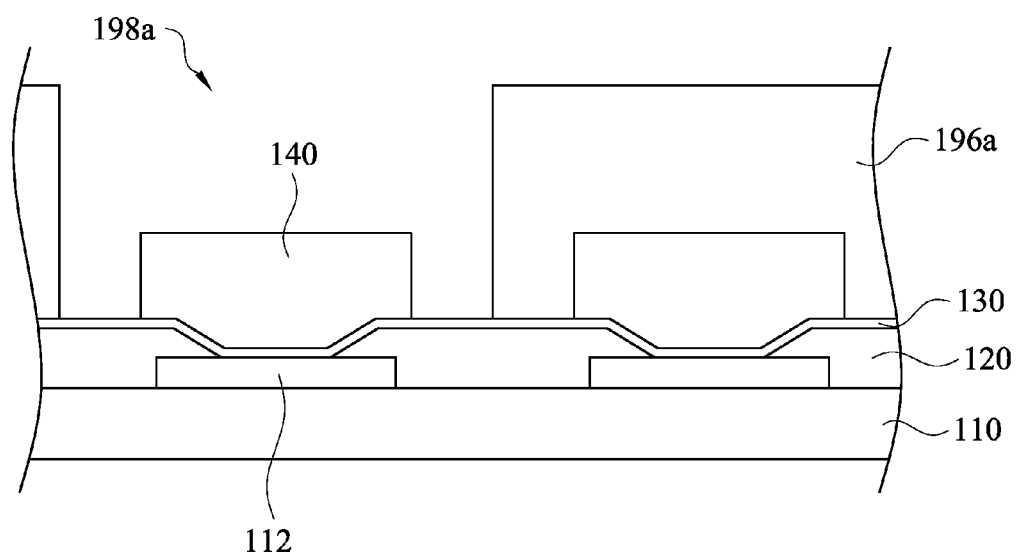
Figure 12C:
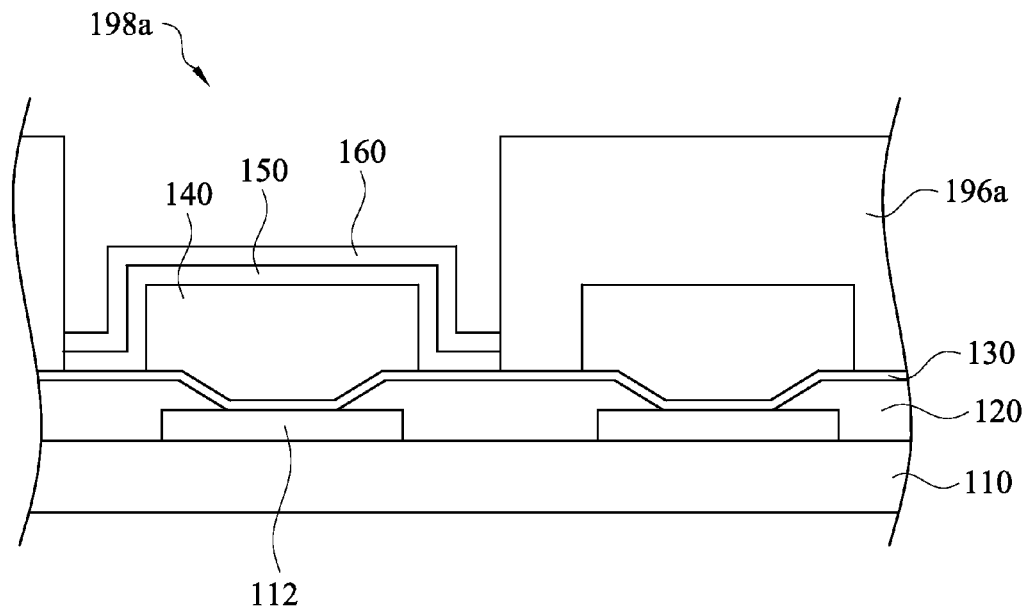

FIGS. 12A to 12D are cross-sectional views of an inductor structure 100b when being manufactured according to one embodiment of the present invention. In this embodiment, the manufacturing process before FIG. 12A are similar to FIGS. 5 to 8, and will not described again. After the copper bumps 140 are formed on the conductive layer 130 that is in the first photoresist layer openings 194, the first photoresist layer 192 shown in FIG. 8 may be removed. Substantially, the structure shown in FIG. 12A is obtained. Thereafter, a patterned second photoresist layer 196a may be formed on the conductive layer 130 of FIG. 12A, such that at least one copper bump 140 may be exposed through a second photoresist layer opening 198a, and the structure shown in FIG. 12B is obtained. Next, the diffusion barrier layer 150 and the oxidation barrier layer 160 may be formed on the copper bump 140 in the second photoresist layer opening 198a shown in FIG. 12B by an electrolytic deposition treatment, and the structure shown in FIG. 12C is obtained.

Figure 12D:
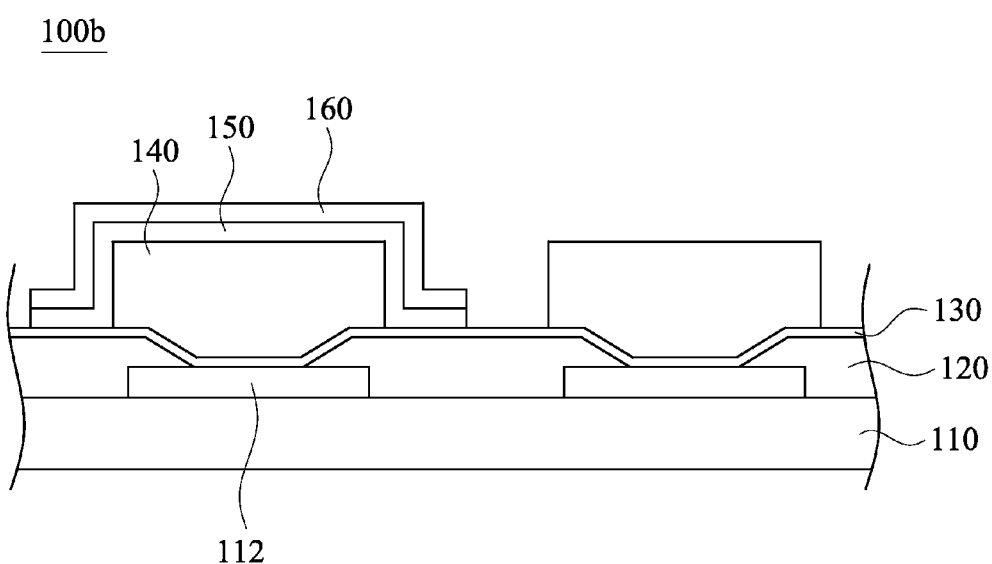

As a result, after the second photoresist layer 196a shown in FIG. 12C is removed, the inductor structure 100b shown in FIG. 12D may be obtained.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An inductor structure comprising:
   a substrate having a plurality of bond pads;
   a protection layer located on the substrate and the bond pads and comprising a plurality of protection layer openings, wherein the bond pads are respectively located below the protection layer openings;
   a patterned conductive layer located on the bond pads and a surface of the protection layer adjacent to the protection layer openings;
   a first copper bump located on the patterned conductive layer;
   a second copper bump located on the patterned conductive layer;
   a diffusion barrier layer located on the first copper bump, wherein the first copper bump is between the diffusion barrier layer and the patterned conductive layer;
   an oxidation barrier layer located on the diffusion barrier layer, wherein there is no diffusion barrier layer and oxidation barrier layer on the second copper bump; and
   a metal division layer located on a top surface of the oxidation barrier layer, a side surface of the first copper bump, a side surface of the diffusion barrier layer, a side surface of the oxidation barrier layer, a side surface of the second copper bump, and a top surface of the second copper bump, such that the metal division layer covers the top surface of the oxidation barrier layer and surrounds the side surface of the first copper bump, the side surface of the diffusion barrier layer, and the side surface of the oxidation barrier layer, and the metal division layer is in contact with the side surface and the top surface of the second copper bump and completely covers the side surface and the top surface of the second copper bump, wherein the side surface of the first copper bump, the side surface of the diffusion barrier layer, and the side surface of the oxidation barrier layer extend in a vertical direction, and are directly connected in sequence, and are between the top surface of the oxidation barrier layer and the protection layer, and wherein the side surface of the second copper bump is between the top surface of the second copper bump and the protection layer.

2. The inductor structure of claim 1, wherein the metal division layer is made of a material comprising gold.

3. The inductor structure of claim 1, wherein the diffusion barrier layer is made of a material comprising nickel.

4. The inductor structure of claim 1, wherein the oxidation barrier layer is made of a material comprising gold.

5. The inductor structure of claim 1, wherein the side surface of the first copper bump, the side surface of the diffusion barrier layer, and the side surface of the oxidation barrier layer are coplanar.

\* \* \* \* \*